United States Patent
Tang et al.

(10) Patent No.: US 10,026,585 B2
(45) Date of Patent: Jul. 17, 2018

(54) EMITTER, ELECTRON GUN USING EMITTER, ELECTRONIC APPARATUS USING ELECTRON GUN, AND METHOD OF PRODUCING EMITTER

(71) Applicant: National Institute for Materials Science, Tsukuba-shi, Ibaraki (JP)

(72) Inventors: Jie Tang, Tsukuba (JP); Jinshi Yuan, Tsukuba (JP); Han Zhang, Tsukuba (JP); Luchang Qin, Tsukuba (JP)

(73) Assignee: NATIONAL INSTITUTE FOR MATERIALS SCIENCE, Ibaraki (JP)

( * ) Notice: Subject to any disclaimer, the term of this patent is extended or adjusted under 35 U.S.C. 154(b) by 0 days.

(21) Appl. No.: 15/548,623

(22) PCT Filed: Feb. 29, 2016

(86) PCT No.: PCT/JP2016/056017
§ 371 (c)(1),
(2) Date: Aug. 3, 2017

(87) PCT Pub. No.: WO2016/140177
PCT Pub. Date: Sep. 9, 2016

(65) Prior Publication Data
US 2018/0019091 A1    Jan. 18, 2018

(30) Foreign Application Priority Data
Mar. 2, 2015   (JP) ................................. 2015-039959

(51) Int. Cl.
*H01J 9/02*      (2006.01)
*H01J 29/48*     (2006.01)

(52) U.S. Cl.
CPC ............... *H01J 29/48* (2013.01); *H01J 9/02* (2013.01); *H01J 29/481* (2013.01); *H01J 2209/0223* (2013.01)

(58) Field of Classification Search
None
See application file for complete search history.

(56) References Cited

U.S. PATENT DOCUMENTS

| | | | | |
|---|---|---|---|---|
| 2008/0280169 | A1* | 11/2008 | Niu | H01B 1/04 429/409 |
| 2015/0054398 | A1 | 2/2015 | Yan | |
| 2016/0088756 | A1* | 3/2016 | Ramadas | H01L 51/0097 361/728 |

FOREIGN PATENT DOCUMENTS

| | | |
|---|---|---|
| JP | A57047799 | 3/1982 |
| JP | A2014026921 | 2/2014 |

OTHER PUBLICATIONS

J. Yuan et al., Applied Physics Letters, 100, 113111, 2012.
International Search Report for PCT/JP2016/056017 dated May 17, 2016.

* cited by examiner

*Primary Examiner* — Ashok Patel
(74) *Attorney, Agent, or Firm* — Hoffmann & Baron, LLP

(57) ABSTRACT

The emitter of the present invention includes a nanowire. The nanowire is formed from a hafnium carbide (HfC) single crystal, and at least an end portion of the hafnium carbide single crystal, from which electrons are to be emitted, is covered with hafnium oxide ($HfO_2$). In the emitter, the thickness of the hafnium oxide may be 1 nm to 20 nm.

20 Claims, 10 Drawing Sheets

EMITTER, ELECTRON GUN USING EMITTER, ELECTRONIC APPARATUS USING ELECTRON GUN, AND METHOD OF PRODUCING EMITTER

TECHNICAL FIELD

The present invention relates to an emitter, an electron gun using the emitter, an electronic apparatus using the electron gun, and a method of producing the emitter.

Priority is claimed on Japanese Patent Application No. 2015-039959, filed on Mar. 2, 2015, the content of which is incorporated herein by reference.

BACKGROUND ART

With regard to an electron gun in an electronic microscope, various modifications have been made to obtain a high-resolution and high-luminance observation image. Examples of an electron source using the electron gun include a field emission type electron source, a Schottky type electron source, and the like. The electron sources have characteristics in which the tip end of the emitter used in the electron gun is made to be sharp so as to allow an electric field concentration effect to occur at the tip end, and more electrons are emitted from the tip end.

In recent, it is reported that an electron is emitted from a hafnium carbide nanowire, and the hafnium carbide nanowire functions as an emitter (for example, refer to Non-Patent Document 1). However, it can be seen that electron emission characteristics from the hafnium carbide nanowire in Non-Patent Document 1 are deficient in stability, and there is a demand for an improvement in stability.

CITATION LIST

Non-Patent Literature

[Non-Patent Document 1] J. Yuan et al., Applied Physics Letters 100, 113111, 2012

SUMMARY OF INVENTION

Technical Problem

Accordingly, an objective of the present invention is to provide an emitter that stably emits an electron with high efficiency, an electron gun using the emitter, an electronic apparatus using the electron gun, and a method of producing the emitter.

Solution to Problem

An emitter of the present invention includes a nanowire. The nanowire is formed from a hafnium carbide (HfC) single crystal, and at least an end portion of the hafnium carbide single crystal, from which electrons are to be emitted, is covered with hafnium oxide ($HfO_2$). According to this, the above-described problem is solved.

The thickness of the hafnium oxide may be 1 nm to 20 nm.

The thickness of the hafnium oxide may be 1 nm to 10 nm.

The thickness of the hafnium oxide may be 1 nm to 5 nm.

A shape of the end portion, from which electrons are to be emitted, may be formed in a hemispherical shape through field evaporation processing.

A longitudinal direction of the nanowire may match a <100> crystal direction, a <110> crystal direction, or a <111> crystal direction of the hafnium carbide single crystal.

The longitudinal direction of the nanowire may match the <100> crystal direction of the hafnium carbide single crystal, and the end portion may include at least a {111} plane and a {110} plane.

A length of the nanowire in a transverse direction may be 1 nm to 100 nm, and the length of the nanowire in the longitudinal direction may be 500 nm to 30 µm.

An electron gun of the present invention includes at least an emitter. The emitter is the emitter including the above-described nanowire. According to this, the above-described problem is solved.

The emitter may further include a needle and a filament, and the nanowire may be attached to the filament through the needle formed from an element selected from the group consisting of tungsten (W), tantalum (Ta), platinum (Pt), rhenium (Re), and carbon (C).

The electron gun may be a cold-cathode field emission electron gun or a Schottky electron gun.

An electronic apparatus of the present invention includes an electron gun. The electron gun is the above-described electron gun, and the electronic apparatus is one selected from the group consisting of a scanning electron microscope, a transmission electron microscope, a scanning transmission electron microscope, an auger electron spectrometer, an electron energy loss spectrometer, and an energy-dispersive electron spectrometer. According to this, the above-described problem is solved.

A method of producing an emitter of the present invention includes a step of heating a nanowire formed from a hafnium carbide single crystal in an oxygen-containing atmosphere. According to this, the above-described problem is solved.

In the step of heating, an oxygen partial pressure may be in a range of $1\times10^{-9}$ Pa to $1\times10^{-7}$ Pa.

In the step of heating, a heating temperature may be in a range of 400° C. to 800° C.

In the step of heating, heating time may be in a range of 1 minute to 10 minutes.

In the step of heating, the oxygen partial pressure may be in a range of $5\times10^{-9}$ Pa to $5\times10^{-8}$ Pa, the heating temperature may be in a range of 500° C. to 700° C., and the heating time may be in a range of 3 minutes to 7 minutes.

The nanowire formed from the hafnium carbide single crystal may be produced by a method selected from the group consisting of: a chemical vapor deposition (CVD) method; a physical vapor deposition method such as a vapor-liquid-solid (VLS) method, a sputtering method, and a laser ablation method; and a templating method.

The method may further include a step of subjecting a surface of one end of the nanowire, which is formed from the hafnium carbide single crystal, to field evaporation previous to the step of heating.

The method may further include a step of flushing the surface subsequently to the step of subjecting the surface to field evaporation.

Advantageous Effects of Invention

The emitter of the present invention includes the nanowire, the nanowire is formed from a hafnium carbide (HfC) single crystal, and at least an end portion of the hafnium carbide single crystal, from which electrons are to be emitted, is covered with hafnium oxide ($HiO_2$). Since at least the end portion, from which electrons are to be emitted, is covered with hafnium oxide, a work function of the end portion of the nanowire (that is, the hafnium carbide single crystal), from which electrons are to be emitted, decreases due to the covering hafnium oxide. Accordingly, electrons are easily emitted. As a result, the emitter of the present invention is excellent in electron emission characteristics. In addition, a dangling bond on a surface of the hafnium carbide single crystal, from which electrons are to be emitted, is lost due to the covering hafnium oxide. Accordingly, the emitter of the present invention can stably emit electrons over a long period of time.

DESCRIPTION OF EMBODIMENTS

Figure 1:
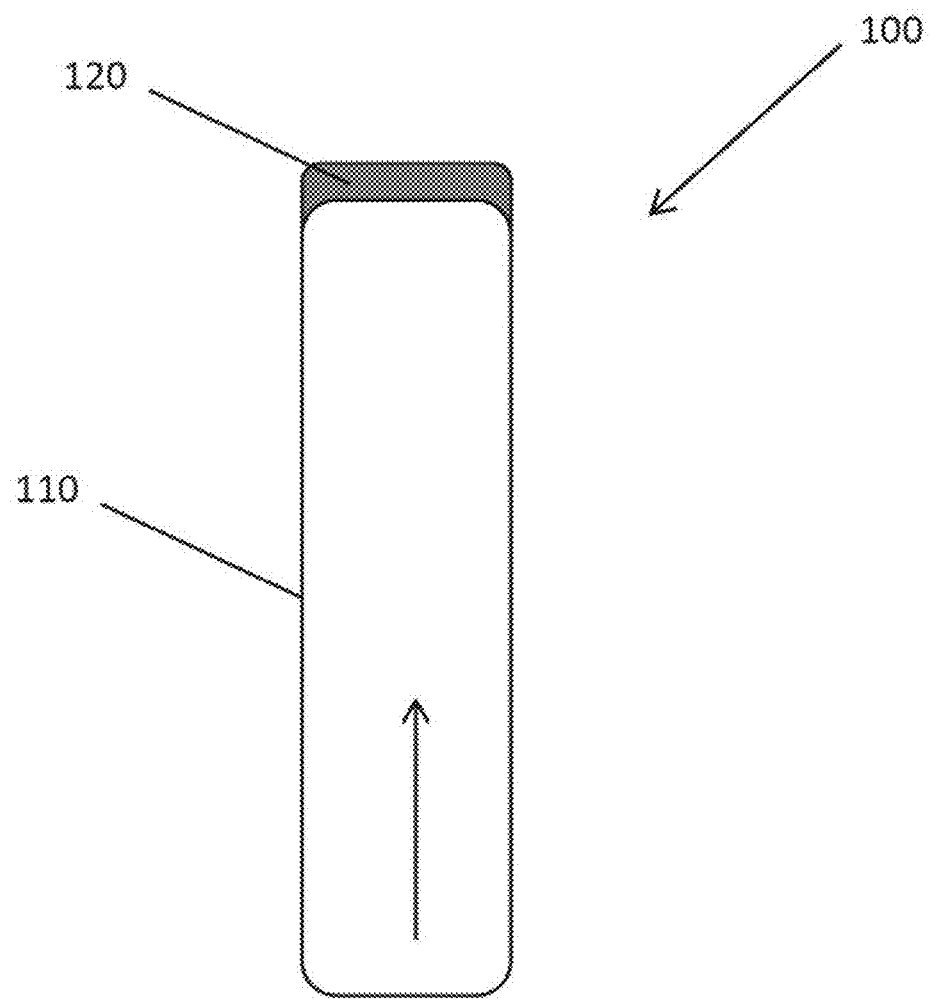
FIG. 1 is a schematic view of an emitter according to an embodiment of the present invention.

Hereinafter, embodiments of the present invention will be described with reference to the accompanying drawings. Furthermore, the same reference numerals will be given to the same elements, and a description thereof will not be repeated.

(Embodiment 1)

In Embodiment 1, a detailed description will be given of an emitter and a method of producing the emitter according to an embodiment of the present invention.

FIG. 1 is a schematic view of the emitter according to this embodiment.

The emitter of this embodiment includes a nanowire 100, and the nanowire 100 is formed from a hafnium carbide (hereinafter, also referred to as "HfC") single crystal 110. At least an end portion (an upper end of the nanowire 100 in FIG. 1) of the HfC single crystal 110, from which electrons are to be emitted, is covered with a hafnium oxide (hereinafter, also referred to as "$HfO_2$") 120. At least the end portion, from which electrons are to be emitted, is covered with the $HfO_2$ 120. Accordingly, a work function of the end portion of the nanowire 100, from which electrons are to be emitted, decreases. Accordingly, the emitter according to this embodiment can easily emit electrons, and is excellent in electron emission characteristics. In addition, a dangling bond on a surface of the end portion of the HfC single crystal 110, from which electrons are to be emitted, is lost due to the $HfO_2$ 120. Accordingly, the emitter of this embodiment can stably emit electrons over a long period of time.

Furthermore, FIG. 1 shows a view in which only the end portion is covered with $HfO_2$. However, even when a part or the entirety of the HfC single crystal 110 including the end portion is covered with $HfO_2$, the same effect is exhibited.

Preferably, a longitudinal direction (a direction indicated by an arrow in FIG. 1) of the nanowire 100 matches a <100> crystal direction, a <110> crystal direction, or a <111> crystal direction of the HfC single crystal 110. According to this, the HfC single crystal 110 in the nanowire 100 becomes a satisfactory single crystal in which cracking, kink, and the like are small.

For example, in a case where the longitudinal direction of the nanowire 100 matches the <100> crystal direction of the HfC single crystal 110, it is possible to obtain a satisfactory HfC single crystal 110 in which cracking, kink, and the like are small. In addition, a crystal plane of the end portion, from which electrons are to be emitted, includes a plane such as {111} and {110} which have a low work function. Accordingly, it is possible to efficiently emit electrons.

For example, in a case where the longitudinal direction of the nanowire 100 matches the <110> crystal direction of the HfC single crystal 110, the crystal plane of the end portion, from which electrons are to be emitted, includes at least a plane such as {111} having a low work function. Accordingly, it is possible to efficiently emit electrons.

For example, in a case where the longitudinal direction of the nanowire 100 matches the <111> crystal direction of the HIT single crystal 110, the crystal plane of the end portion, from which electrons are to be emitted, includes a plane such as {111} having a low work function. Accordingly, it is possible to efficiently emit electrons.

From the viewpoint of easiness of producing or working, quality of a crystal, and the like, it is the most preferable that the longitudinal direction of the nanowire 100 matches the <100> crystal direction of the HfC single crystal 110.

Furthermore, since the HfC single crystal is a cubic, in this specification, in a case where <100>, <110>, and <111> are described as crystal directions of the HfC single crystal, it should be noted that each of the crystal directions includes all crystal directions which are equivalent to the crystal direction. Similarly, in a case where {111}, {110}, and the like are described as crystal planes of the HfC single crystal, it should be noted that each of the crystal planes includes crystal planes with equivalent symmetry.

FIG. 2(A) is a schematic view of an emitter according to another embodiment of the present invention.

Figure 2:
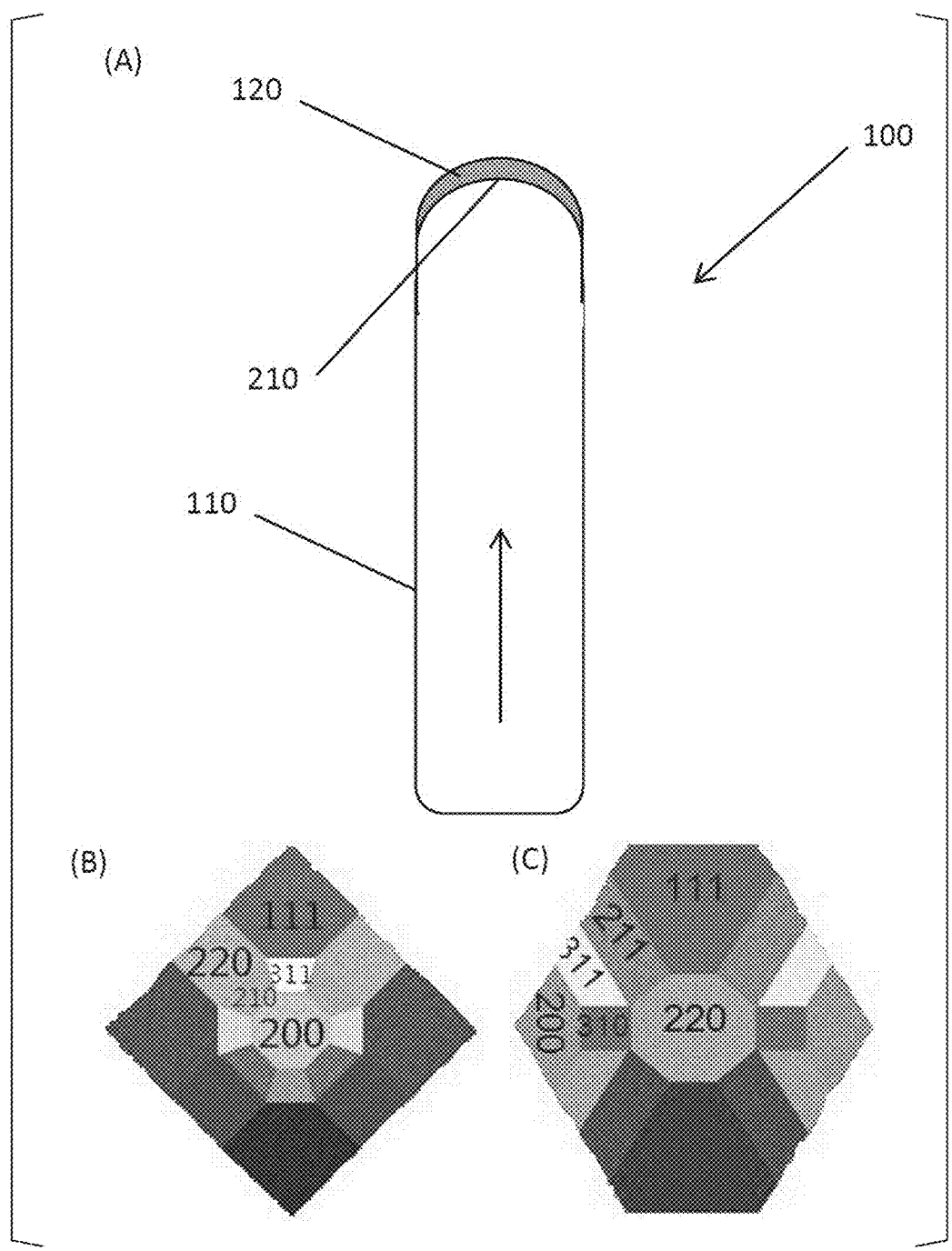
FIG. 2 is a schematic view of an emitter according to another embodiment of the present invention.

As shown in FIG. 2(A), the emitter according to the other embodiment is the same as the emitter shown in FIG. 1 except for a shape of an end portion from which electrons are to be emitted. Specifically, in the emitter shown in FIG. 2, a shape of the end portion from which electrons are to be emitted is a hemispherical shape, and a surface of the end portion is constituted by a hemispherical surface 210. For example, working and processing for obtaining the hemispherical end portion can be performed by field evaporation processing.

Atoms are evaporated from the end portion of the HfC single crystal 110, from which electrons are to be emitted, through field evaporation. Contaminant matters or impurities, which are adhered to the evaporated atoms, are also removed. Accordingly, the end portion becomes clean. In addition, a crystal plane of the end portion is exposed due to the atom evaporation. As a result, the hemispherical surface 210 is formed. From this viewpoint, it is preferable that the end portion of the HfC single crystal 110, from which electrons are to be emitted, has a hemispherical shape formed by the field evaporation.

FIG. 2(B) is a schematic view showing a crystal plane on the hemispherical surface 210 in a case where the longitudinal direction of the nanowire 100 matches the <100> crystal direction of the HfC single crystal 110. As shown in FIG. 2(B), the hemispherical surface 210, from which electrons are to be emitted, reliably includes a plane such as a {111} plane and a {110} plane which have a low work function through the field evaporation. Accordingly, it is possible to emit electrons in a more efficient manner.

Similarly, FIG. 2(C) is a schematic view showing a crystal plane on the hemispherical surface 210 in a case where the longitudinal direction of the nanowire 100 matches the <110> crystal direction of the HfC single crystal 110. As shown in FIG. 2(C), the hemispherical surface 210, from which electrons are to be emitted, reliably includes at least a {111} plane having a low work function due to the field evaporation. Accordingly, it is possible to emit electrons in a more efficient manner.

Returning to FIG. 1 and FIG. 2(A), description will be given of the nanowire 100.

A nanowire is intended to have a wire shape in a nano order. It is preferable that a cross-section of the nanowire 100 has a circular shape. In addition, preferably, a length of the nanowire 100 in a transverse direction (that is, a diameter) is in a range of 1 nm to 100 nm, and a length in the longitudinal direction is in a range of 500 nm to 30 µm. According to the above-described sizes, electric field concentration to the end portion, from which electrons are to be emitted, is allowed to effectively occur, and it is possible to emit more electrons from the end portion.

More preferably, the length of the nanowire 100 in the transverse direction is in a range of 10 nm to 60 nm, and the length in the longitudinal direction is in a range of 5 µm to 30 µm. For example, in a case of producing the nanowire 100 by using a chemical vapor deposition (CVD) method to be described later, it is possible to easily provide the nanowire 100 which has dimensions in the above-described range and is formed from an HfC single crystal with good quality without cracking, kink, and the like.

Preferably, the thickness of the $HfO_2$ 120 is 1 nm to 20 nm. In a case where the thickness of the $HfO_2$ 120 is less than 1 nm, a work function of the end portion, from which electrons are to be emitted, does not decrease. Therefore, electron emission characteristics may deteriorate. In a case where the thickness of the $HfO_2$ 120 is greater than 20 nm, electrons from the HfC single crystal 110 cannot be physically emitted due to the thickness of the $HfO_2$ 120 (emission of electrons is hindered by the $HfO_2$ 120). Therefore, there is a concern that electron emission characteristics may deteriorate.

More preferably, the thickness of the $HfO_2$ 120 is 1 nm to 10 nm. When the thickness of the $HfO_2$ 120 is in this range, a work function of the end portion, from which electrons are to be emitted, decreases. Accordingly, satisfactory electron emission characteristics can be obtained. Still more preferably, the thickness of the $HfO_2$ 120 is 1 nm to 5 nm. When the thickness of the $HfO_2$ 120 is in this range, the work function of the end portion, from which electrons are to be emitted, decreases. Accordingly, it is possible to reliably obtain satisfactory electron emission characteristics.

In FIG. 1 and FIG. 2, the nanowire 100 is shown as an emitter itself, but there is no limitation thereto. For example, the emitter may be the nanowire 100 itself, the nanowire 100 may be integrally attached to a needle, or they may be further attached to a filament.

Next, a description will be given of a method of producing the emitter of this embodiment.

Figure 3:
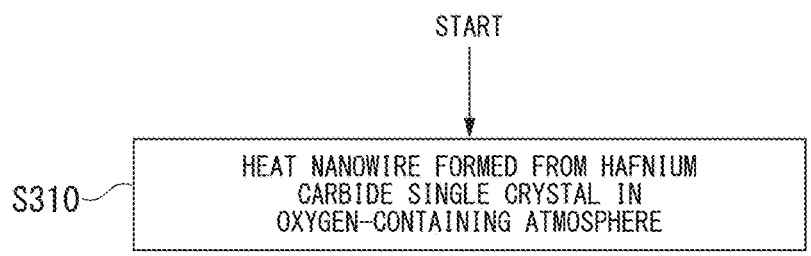
FIG. 3 is a flowchart showing a method of producing the emitter according to the embodiment of the invention.

FIG. 3 is a flowchart showing the method of producing the emitter of this embodiment.

In step S310, the nanowire 100 formed from the hafnium carbide (HfC) single crystal 110 is heated in an oxygen-containing atmosphere. According to this, at least an end portion of the HfC single crystal is oxidized and is covered with the $HfO_2$ 120 (FIG. 1, FIG. 2).

Here, the method of producing the nanowire 100 formed from the HfC single crystal 110 is not particularly limited, but may be produced by a method selected from the group consisting of a chemical vapor deposition (CVD) method using a metal catalyst, a physical vapor deposition (PVD) method such as a vapor-liquid-solid (VLS) method, a sputtering method, and a laser ablation method, and a templating method.

In step S310, it is preferable that an oxygen partial pressure is in a range of $1 \times 10^{-9}$ Pa to $1 \times 10^{-7}$ Pa. When the oxygen partial pressure is less than $1 \times 10^{-9}$ Pa, there are some cases where the end portion of the HfC single crystal is not oxidized and therefore the $HfO_2$ 120 may not be formed. When the oxygen partial pressure is greater than $1 \times 10^{-7}$ Pa, there is a concern that the film thickness of the $HfO_2$ 120 exceeds 20 nm and therefore the electron emission characteristics may deteriorate. More preferably, the oxygen partial pressure is in a range of $5 \times 10^{-9}$ Pa to $5 \times 10^{-8}$ Pa. In this range, oxidation of the end portion of the HfC single crystal 110 can be promoted.

In step S310, it is preferable that a heating temperature is in a range of 400° C. to 800° C. When the heating temperature is lower than 400° C., there are some cases where the end portion of the HfC single crystal 110 is not oxidized and therefore the $HfO_2$ 120 may not be formed. When the heating temperature is higher than 800° C., there is a concern that the $HfO_2$ 120 with good quality is not formed and therefore the electron emission characteristics may deteriorate. More preferably, the heating temperature is in a range of 500° C. to 700° C. In this range, the oxidation of the end portion of the HfC single crystal is promoted. Accordingly, the $HfO_2$ with good quality is obtained.

In step S310, it is preferable that heating time is in a range of 1 minute to 10 minutes. When the heating temperature is shorter than 1 minute, there are some cases where the end portion of the HfC single crystal is not oxidized and therefore the $HfO_2$ 120 may not be formed. When the heating time is longer than 10 minutes, there is a concern that the $HtO_2$ 120 with good quality is not formed and the film thickness of the $HfO_2$ 120 exceeds 20 nm and therefore the electron emission characteristics may deteriorate. Preferably, the heating time is in a range of 3 minutes to 7 minutes. In this range, it is easy to obtain $HfO_2$ in a range of 1 nm to 20 nm.

In step S310, when the oxygen partial pressure, the heating temperature, and the heating time satisfy the above-described range, the $HfO_2$ 120 having a thickness of 1 nm to 20 nm is preferably formed.

Step S310 may be performed immediately after producing the nanowire 100 formed from the HfC single crystal 110, may be performed after attaching the nanowire 100 to a needle, a filament, and the like, or may be performed during the production of an electron gun including the emitter.

Preferably, a step of subjecting a surface of one end of the nanowire 100 (that is, an end portion from which electrons are to be emitted), which is formed from the HfC single crystal 110, to the field evaporation may be performed previous to step S310. In this case, a high electric field of 1 V/nm to 10 V/nm may be applied to the one end of the nanowire. According to this, the one end of the nanowire 100 becomes clean, and the hemispherical surface 210 (FIG. 2), of which a crystal plane is exposed, can be obtained. Subsequently to the step of subjecting the surface to field evaporation, oxygen may be introduced to perform step S310.

In addition, a flushing step may be performed subsequently to the above-described step of subjecting the surface to field evaporation. Carbon (C), which exists on a surface of the HfC single crystal 110 (typically, the surface is terminated with stable C) is removed through the flushing. According to this, the surface can be terminated with hafnium (Hf). Subsequently, when step S310 is executed, since Hf at the termination is not stable, the end portion of the HfC single crystal 110 can be reliably oxidized and can be covered with the $HfO_2$ 120. Furthermore, the flushing step is the same as typical flushing processing. For example, the HfC single crystal may be connected to a power supply for flushing to perform electrical heating.

(Embodiment 2)

In Embodiment 2, a detailed description will be given of an electron gun including the emitter according to the embodiment of the present invention.

Figure 4:
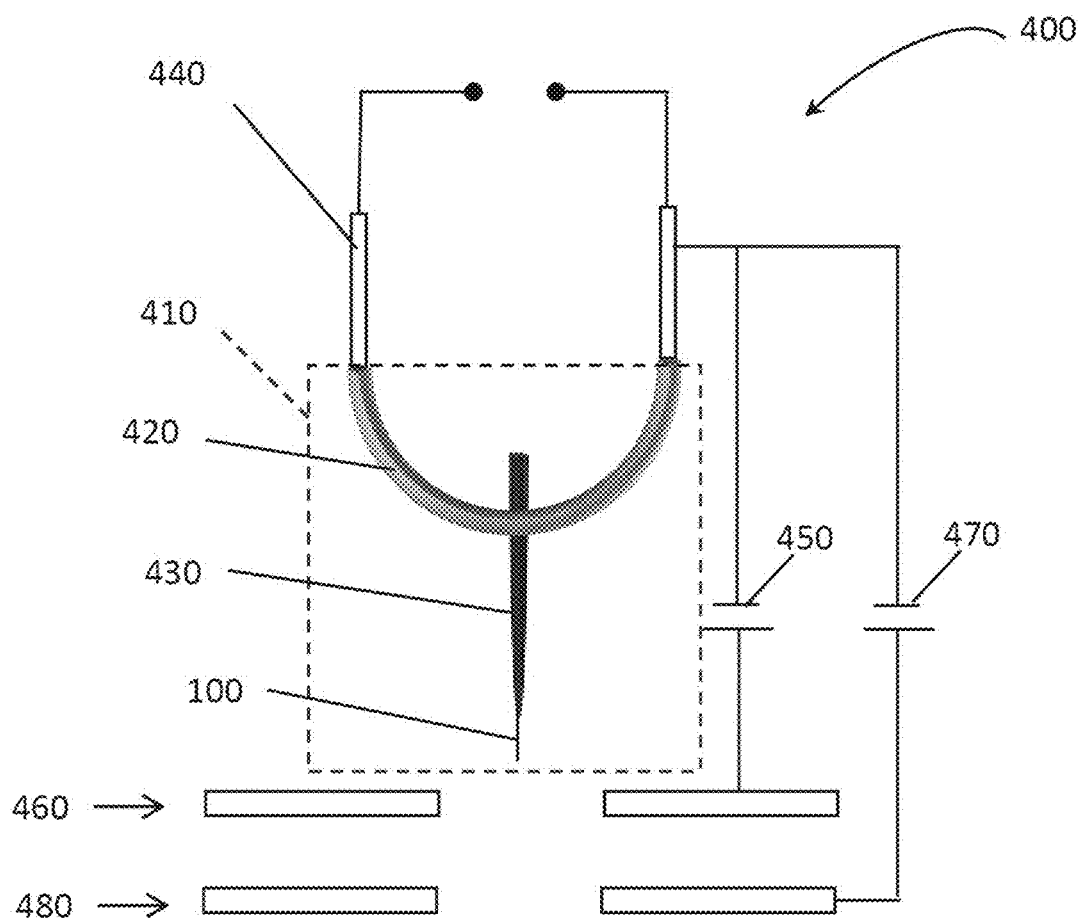
FIG. 4 is a schematic view showing an electron gun including the emitter according to the embodiment of the present invention.

FIG. 4 is a schematic view showing the electron gun including the emitter of this embodiment.

An electron gun 400 of this embodiment includes an emitter 410 including at least the nanowire 100 described in Embodiment 1. In FIG. 4, the emitter 410 further includes a filament 420 and a needle 430 in addition to the nanowire 100.

The nanowire 100 is attached to the filament 420 through the needle 430 formed from an element selected from the group consisting of tungsten (W), tantalum (Ta), platinum (Pt), rhenium (Re) and carbon (C). According to this, handling of the nanowire 100 becomes convenient. Accordingly, the configuration is preferable. In addition, the nanowire 100 is attached to the needle 430 by a conductive adhesive sheet such as a carbon pad. Furthermore, in FIG. 4, the filament 420 has a hair-pin type shape (U-shape). However, there is no limitation to the shape, and the shape of the filament 420 may be an arbitrary shape such as a V-shape.

In the electron gun 400, a lead-out power supply 450 is connected between an electrode 440 and a lead-out electrode 460, and the lead-out power supply 450 applies a voltage between the emitter 410 and the lead-out electrode 460. In addition, in the electron gun 400, an acceleration power supply 470 is connected between the electrode 440 and an acceleration electrode 480, and the acceleration power supply 470 applies a voltage between the emitter 410 and the acceleration electrode 480.

In a case where the electron gun 400 is a cold-cathode field emission electron gun, the electrode 440 may be connected to a flash power supply. In a case where the electron gun 400 is a Schottky electron gun, the electrode 440 may be connected to a heating power supply.

Furthermore, the electron gun 400 may be disposed in vacuo of $10^{-8}$ Pa to $10^{-7}$ Pa. In this case, it is possible to maintain an end portion of the emitter 410, from which electrons are to be emitted, to be clean.

Brief description will be given of an operation in a case where the electron gun 400 of this embodiment is the cold-cathode field emission electron gun.

The lead-out power supply 450 applies a voltage between the emitter 410 and the lead-out electrode 460. According to this, electric field concentration is allowed to occur to an end portion of the nanowire 100 of the emitter 410 from which electrons are to be emitted, and electrons are taken out. In addition, the acceleration power supply 470 applies a voltage between the emitter 410 and the acceleration electrode 480. According to this, electrons, which are taken out from the end portion of the nanowire 100 of the emitter 410, from which electrons are to be emitted, are accelerated, and are emitted toward a sample. Furthermore, flushing may be appropriately performed by the flash power supply connected to the electrode 440 to clean the surface of the nanowire 100. The operations are performed in vacuo as described above.

Brief description will be given of an operation in a case where the electron gun 400 of this embodiment is a Schottky electron gun.

The heating power supply connected to the electrode 440 heats the emitter 410, and the lead-out power supply 450 applies a voltage between the emitter 410 and the lead-out electrode 460. According to this, Schottky emission is allowed to occur at the end portion of the nanowire 100 of the emitter 410 from which electrons are to be emitted, and electrons are taken out. In addition, the acceleration power supply 470 applies a voltage between the emitter 410 and the acceleration electrode 480. According to this, electrons, which are taken out from the end portion of the nanowire 100 of the emitter 410 from which electrons are to be emitted, are accelerated, and are emitted toward a sample. The operations are performed in vacuo as described above. In addition, thermoelectrons can be emitted from the nanowire 100 of the emitter 410 by the heating power supply. Accordingly, the electron gun 400 may further include a suppressor (not shown) that shields the thermoelectrons.

Since the electron gun 400 of this embodiment includes the emitter 410 including the nanowire 100 that is described in detail in Embodiment 1, electrons are easily emitted. Accordingly, electrons can be stably emitted over a long period of time. The electron gun 400 as described above is employed to an arbitrary electronic apparatus having electron focusing capability. For example, the electronic apparatus is selected from the group consisting of a scanning electron microscope, a transmission electron microscope, a scanning transmission electron microscope, an auger electron spectrometer, an electron energy loss spectrometer, and an energy-dispersive electron spectrometer.

Next, the present invention will be described in detail with reference to specific examples, but it should be noted that the present invention is not limited to the examples.

EXAMPLES

Reference Example 1

In Reference Example 1, a nanowire formed from a hafnium carbide (HfC) single crystal was produced by the CVD method.

Figure 5:
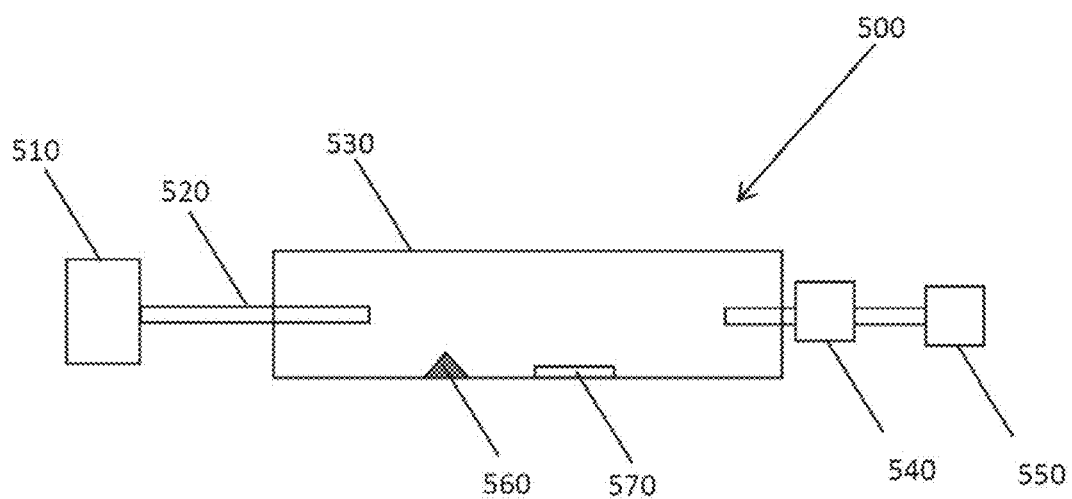
FIG. 5 is a schematic view showing an apparatus for producing a nanowire that is formed from a hafnium carbide single crystal.

FIG. 5 is a schematic view showing an apparatus for producing the nanowire formed from the hafnium carbide single crystal.

A producing apparatus 500 shown in FIG. 5 includes a gas raw material supply source 510, a heatable reaction chamber 530 to which the raw material from the gas raw material supply source 510 is supplied through a line 520, a dryer 540 that suctions and dries an unreacted raw material, a byproduct, and the like, and a pump 550 that evacuates the inside of the reaction chamber 530 to a vacuum state.

Synthesis of the HfC single crystal is based on the following reaction formula.

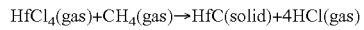

$$HfCl_4(gas) + CH_4(gas) \rightarrow HfC(solid) + 4HCl(gas)$$

The gas raw material supply source 510 was connected to a methane gas line and an $H_2$ gas line. A quartz tube furnace (inner diameter: 64 mm) was used as the reaction chamber 530, and an $HfCl_4$ powder 560 (purity: 99.55%, manufactured by Sigma-Aldrich Co. LLC.) as a raw material and a graphite substrate 570 as a synthesis substrate were disposed at the inside of the reaction chamber 530. The $HfCl_4$ powder 560 was disposed at a low-temperature region of the reaction chamber 530. The graphite substrate 570 was disposed at the central portion of the reaction chamber 530. As a catalyst, nickel (Ni) nanoparticles (particle size: several tens of nanometers) were dispersed on the graphite substrate 570.

The inside of the reaction chamber 530 was evacuated to $10^{-1}$ Pa or less by the pump 550. Temperature was increased until a temperature of the central portion at which the graphite substrate 570 was disposed reached 1280° C. On the other hand, a temperature of the low-temperature region at which the $HfCl_4$ powder 560 was disposed was maintained at 200° C.

Subsequently, a hydrogen ($H_2$) gas and a methane gas were allowed to flow from the gas raw material supply source 510. An $HfCl_4$ gas, which was disposed in the reaction chamber 530 and was vaporized, was introduced onto the graphite substrate 570 by the $H_2$ gas. In addition, the methane gas was also introduced onto the graphite substrate 570. At this time, flow rates of the $H_2$ gas and the methane gas were respectively set to 1 L/minute and 20 mL/minutes.

As a result, a needle-like substance was generated on the graphite substrate 570. The needle-like substance was observed with a scanning electron microscope (SEM, JSM-6500F, manufactured by, JEOL) including an energy dispersive X-ray analyzer (EDS). The results are shown in FIG. 6.

Figure 6:
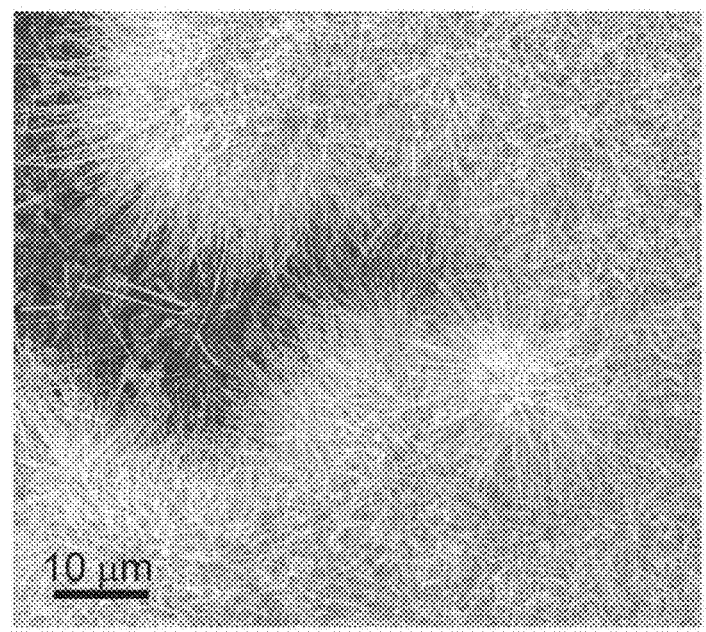
FIG. 6 is a SEM image showing an appearance of a needle-like substance that is synthesized on a graphite substrate according to Reference Example 1.

FIG. 6 is a SEM image showing an appearance of the needle-like substance that is synthesized on the graphite substrate according to Reference Example 1.

As shown in FIG. 6, the needle-like substance was an assembly of straight nanowires having a length of several hundreds of nm to several tens of μm. Although not shown, in a result of EDS measurement performed with respect to the needle-like substance, only Hf and C were detected, and an atomic ratio thereof was 1:1. From the result, it was confirmed that the synthesized nanowire was hafnium carbide (HfC).

Next, from the assembly of the nanowires formed from the HfC single crystal, a nanowire formed from an HfC single crystal having a <100> crystal direction in a growth direction (longitudinal direction) (hereinafter, also referred to simply as "<100> nanowire"), a nanowire formed from an HfC single crystal having a <110> crystal direction in the growth direction (hereinafter, also referred to simply as "<110> nanowire"), and a nanowire formed from an Hft single crystal having a <111> crystal direction in the growth direction (hereinafter, also referred to simply as "<111> nanowire") were collected, and were observed with a transmission electron microscope (TEM, JEOL-2100F, manufactured by JEOL). The observation results are shown in FIG. 7, FIG. 8, and FIG. 9.

Figure 7:
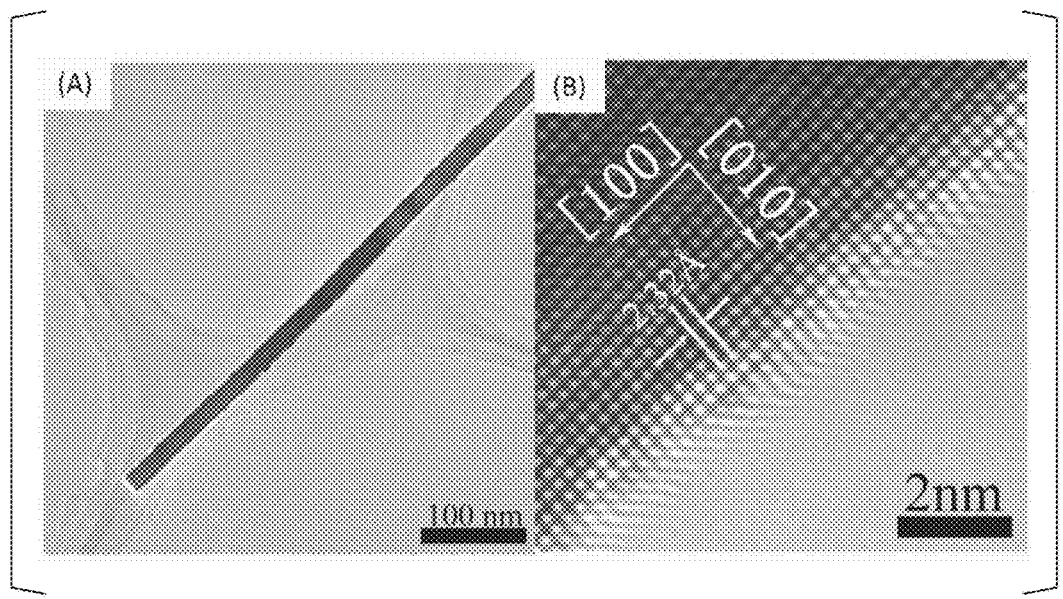
FIG. 7 is a low-magnification TEM image (A) and an HRTEM image (B) of a nanowire formed from a HC single crystal having a <100> crystal direction according to Reference Example 1.

FIG. 7 is a low-magnification TEM image (A) and an HRTEM (high-resolution transmission electron microscope) image (B) of the nanowire formed from the HfC single crystal having the <100> crystal direction according to Reference Example 1.

Figure 8:
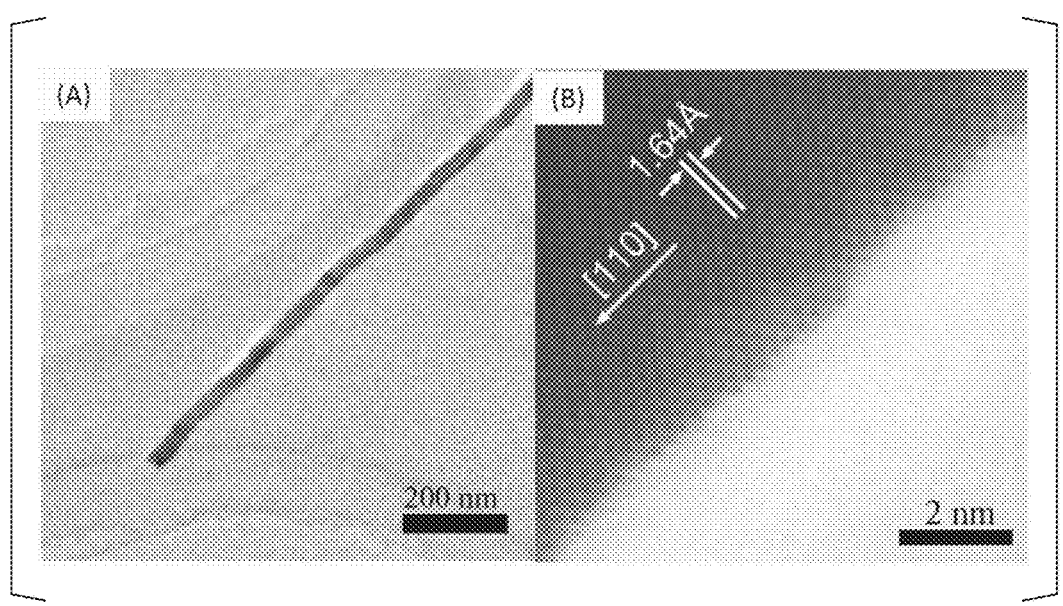
FIG. 8 is a low-magnification TEM image (A) and an HRTEM image (B) of a nanowire formed from a HIC single crystal having a <110> crystal direction according to Reference Example 1.

FIG. 8 is a low-magnification TEM image (A) and an HRTEM image (B) of the nanowire formed from the HfC single crystal having the <110> crystal direction according to Reference Example 1.

Figure 9:
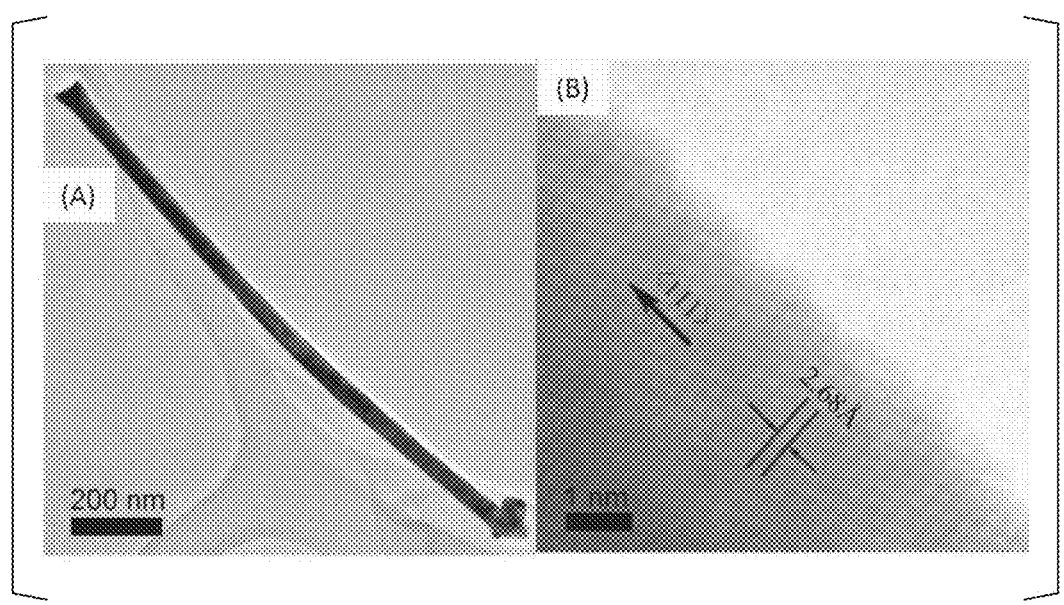
FIG. 9 is a low-magnification TEM image (A) and an HRTEM image (B) of a nanowire formed from a HIC single crystal having a <111> crystal direction according to Reference Example 1.

FIG. 9 is a low-magnification TEM image (A) and an HRTEM image (B) of the nanowire formed from the HfC single crystal having the <111> crystal direction according to Reference Example 1.

According to FIG. 7(A), it could be seen that the nanowire in FIG. 7(A) had a length of 30 nm to 40 nm in a transverse direction and a length of 500 nm to 15 μm in a longitudinal direction. Although not shown, according to selected area electron diffraction (SAED), it was confirmed that the nanowire was a single crystal. From FIG. 7(B), it could be seen that a growth direction of the nanowire matched <100>.

From FIG. 8(A), it could be seen that the nanowire in FIG. 8(A) had a length of 25 nm to 35 nm in a transverse direction and a length of 500 nm to 15 μm in a longitudinal direction. From FIG. 8(B), it could be seen that the growth direction of the nanowire matched <110>.

From FIG. 9(A), it could be seen that the nanowire in FIG. 9(A) had a length of 45 nm to 55 nm in a transverse direction and a length of 500 nm to 1 μm in a longitudinal direction. From FIG. 9(B), it could be seen that the growth direction of the nanowire matched <111>.

In addition, in any TEM images, a surface of the nanowire after synthesis was clean in terms of an atom. When employing the above-described CVD method, it was confirmed that a nanowire formed from the HfC single crystal is obtained.

Comparative Example 2

In Comparative Example 2, an emitter was produced by using the <100> nanowire obtained in Reference Example 1.

Figure 10:
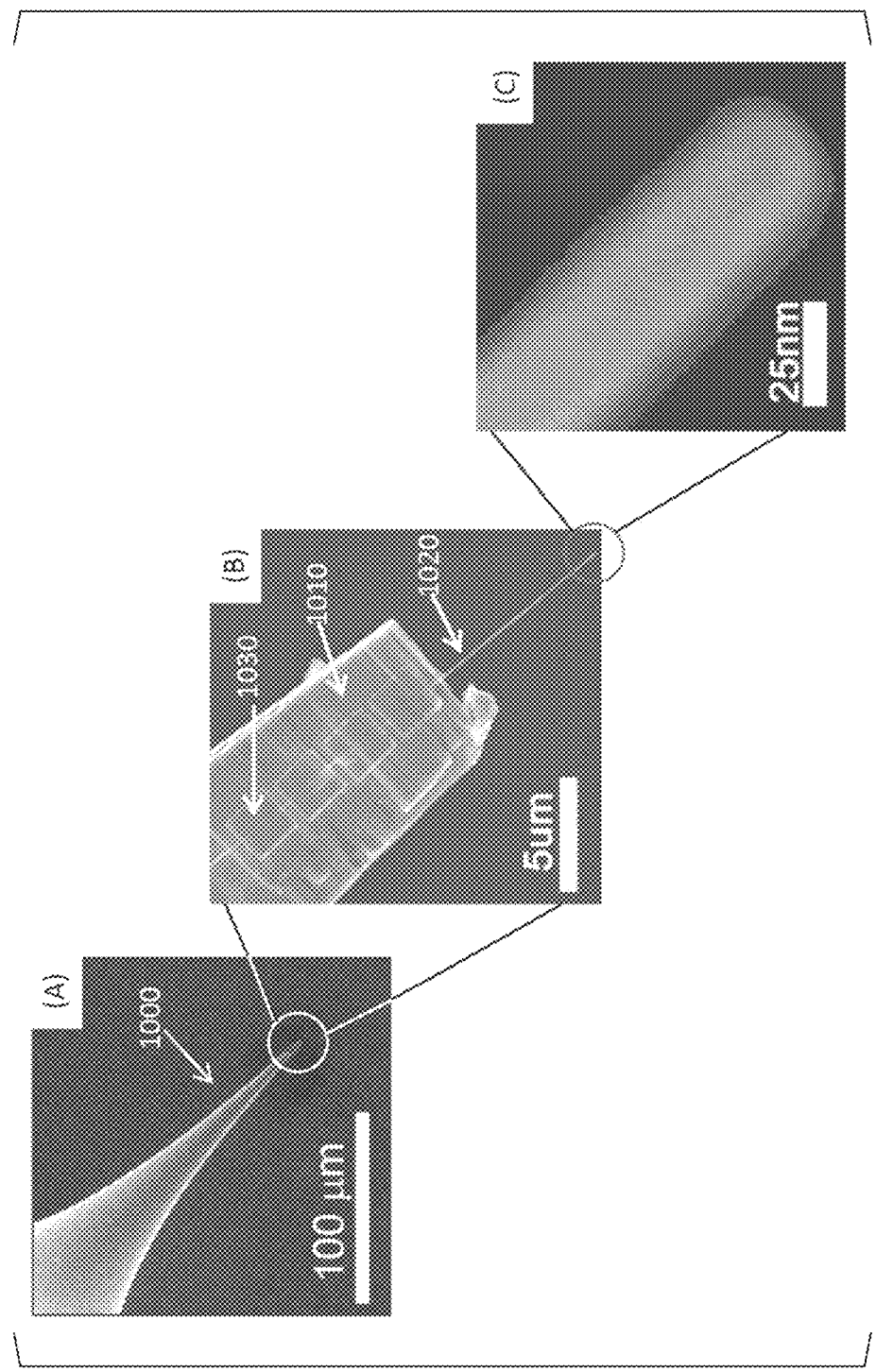
FIG. 10 is a SEM image of an emitter in Comparative Example 2.

A sequence of producing the emitter was as follows. A tantalum wire was etched to be processed into a Ta needle in which one end was tapered. Subsequently, the Ta needle was connected to a hair-pin type tungsten filament through welding. The <100> nanowire was fixed to the tapered Ta needle by using a carbon pad. These workings were performed by using a focused ion beam (FIB) system. The emitter obtained as described above was observed with the SEM. Subsequently, the tip end of the nanowire was subjected to field evaporation by using a field ion microscope (FIM), and cleaning and smoothing were performed. An appearance of the nanowire after the field evaporation was observed with the SEM. The results are shown in FIG. 10.

Next, a FIM image of the tip end of the nanowire after the field evaporation was observed, and a facet model of the tip end was simulated from the observation result. The results are shown in FIGS. 11(A) and 11(B).

A lead-out voltage polarity of the tip end of the nanowire after the field evaporation was inverted to allow field emission to occur, and a field emission pattern was observed. Result is shown in FIG. 12(A). In addition, after flushing the tip end of the nanowire, time dependency of a field emission current at room temperature and a lead-out voltage of 700 V were measured. The result is shown in FIG. 13(A).

Comparative Example 3

In Comparative Example 3, an emitter was produced by using the <110> nanowire obtained in Reference Example 1. The emitter was produced in the same sequence as in Comparative Example 2 except that the <110> nanowire was used instead of the <100> nanowire.

A FIM image of the obtained emitter was observed in the same manner as in Comparative Example 2, and simulation of a facet model thereof was performed to observe a field emission pattern. The results are shown in FIGS. 11(C) and 11(D), and FIG. 12(B). In addition, time dependency of the field emission current was measured.

Comparative Example 4

In Comparative Example 4, an emitter was produced by using the <111> nanowire obtained in Reference Example 1. The emitter was produced in the same sequence as in Comparative Example 2 except that the <111> nanowire was used instead of the <100> nanowire.

A FIM image of the obtained emitter was observed in the same manner as in Comparative Example 2, and simulation of a facet model thereof was performed to observe a field emission pattern. In addition, time dependency of the field emission current was measured.

Example 5

In the emitter produced in Comparative Example 2, an end portion of the nanowire, from which electrons are to be emitted, formed from the HfC single crystal having the <100> crystal direction was covered with hafnium oxide (HfO$_2$).

A sequence of producing the emitter covered with HfO$_2$ was as follows. In Comparative Example 2, field evaporation and flushing were performed, oxygen was introduced into the chamber, and heating was performed in an oxygen-containing atmosphere (step S310 in FIG. 3). Specifically, an oxygen pressure inside the chamber was set to $1.1 \times 10^{-8}$ Pa, and heating was performed at 600° C. for 5 minutes. The film thickness of HfO$_2$ was estimated at 2 nm based on an HfO$_2$ growth rate under these conditions.

With respect to the emitter obtained as described above, time dependency of the field emission current was measured in the same manner as in Comparative Example 2. The result is shown in FIG. 13(B).

Example 6

In the emitter produced in Comparative Example 3, an end portion of the nanowire, from which electrons are to be emitted, formed from the HfC single crystal having the <110> crystal direction was covered with hafnium oxide (HfO$_2$) in the same manner as in Example 5. The time dependency of the field emission current of the obtained emitter was measured.

Example 7

In the emitter produced in Comparative Example 4, an end portion of the nanowire, from which electrons are to be emitted, formed from the HfC single crystal having the <111> crystal direction was covered with hafnium oxide (HfO$_2$) in the same manner as in Example 5. The time dependency of the field emission current of the obtained emitter was measured.

The results of Comparative Examples 2 to 4 and Examples 5 to 7 will be described in detail.

FIG. 10 is a SEM image of the emitter in Comparative Example 2.

FIG. 10(A) is an appearance of the entirety of an emitter 1000 in Comparative Example 2. FIG. 10(B) shows an appearance of a <100> nanowire 1020 fixed to a tapered Ta needle 1010 through a carbon pad 1030. FIG. 10(C) shows an appearance of an end portion of the <100> nanowire 1020, from which electrons are to be emitted, after the field evaporation, in which the shape of the end portion was a hemispherical shape. Although not shown, appearances of the entirety of the emitters and appearances of end portions of the emitters from which electrons are to be emitted in Comparative Examples 3 and 4, and Examples 5 to 7 were similar to those in Comparative Example 2.

Figure 11:
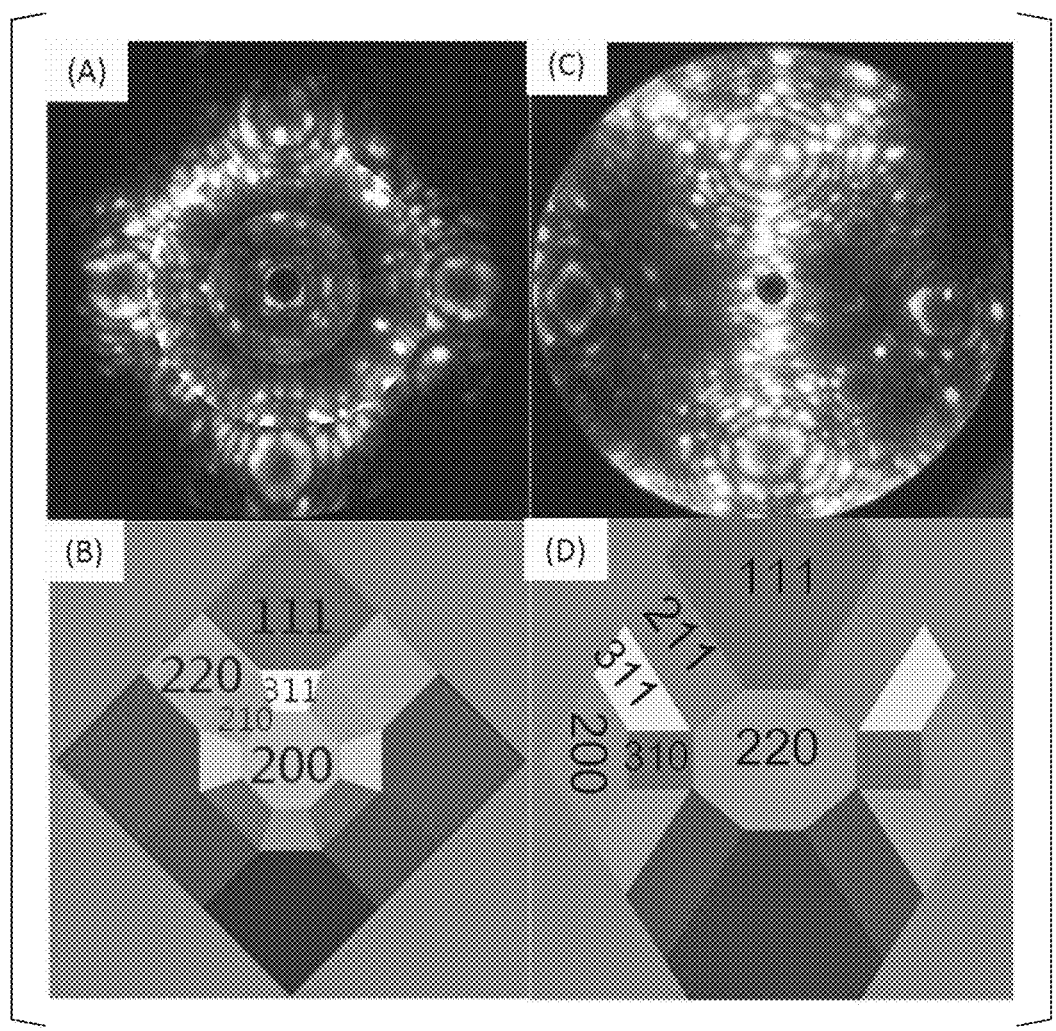
FIG. 11 is a view showing FIM images and simulation results of an end portion of nanowires in emitters in Comparative Examples 2 and 3.

FIG. 11 is a view showing FIM images and simulation results of an end portion of nanowires in emitters in Comparative Examples 2 and 3.

FIGS. 11(A) and 11(B) show the FIM image and the simulation result of the end portion of nanowire in the emitter in Comparative Examples 2, respectively. FIGS. 11(C) and 11(D) show the FIM image and the simulation result of the end portion of nanowire in the emitter in Comparative Examples 3, respectively.

As shown in FIGS. 11(A) and 11(B), it could be seen that a hemispherical tip end of the <100> nanowire in the emitter in Comparative Example 2 was constituted by facets having miller indexes {100}, {110}, {111}, {311}, and {210}. Here, since the HfC single crystal is a cubic, it should be noted that the above-described miller indexes are shown on planes having equivalent symmetry to the miller indexes shown in FIG. 11(B).

Similarly, as shown in FIGS. 11(C) and 11(D), it could be seen that a hemispherical tip end of the <10> nanowire in the emitter in Comparative Example 3 was constituted by facets having miller indexes {100}, {110}, {111}, {311}, {211}, and {310}.

Although not shown, it could be seen that a hemispherical tip end of the <111> nanowire in the emitter in Comparative Example 4 was also constituted by a facet having at least a miller index {111}.

Figure 12:
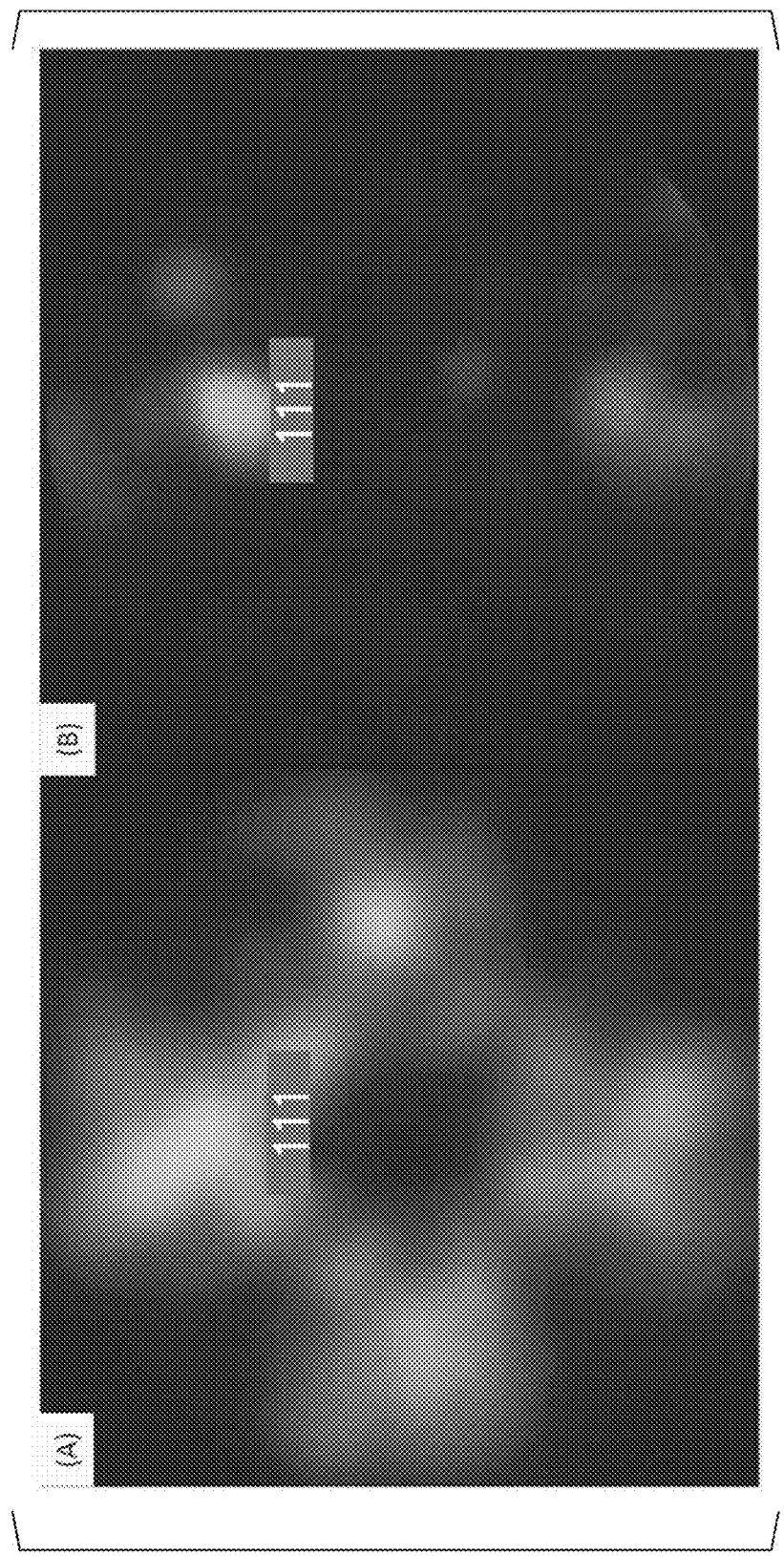
FIG. 12 is a field emission pattern of the end portion of the nanowires in the emitters in Comparative Examples 2 and 3.

FIG. 12 is a field emission pattern of the end portion of the nanowires in the emitters in Comparative Examples 2 and 3.

FIGS. 12(A) and 12(B) show the field emission pattern of the end portion of the nanowires in the emitters in Comparative Examples 2 and 3, respectively. Both of FIGS. 12(A) and 12(B) have a brighter region (region which field-emits) in a gray scale.

Therefrom, it could be seen that the emitters in Comparative Examples 2 and 3 field-emits.

As shown in FIG. 12(A), a region corresponding to the {111} plane is the most brightly shown, and a region corresponding to the {110} plane is the second brightly shown. Thus, it could be seen that field emission occurs from these planes. That is, it could be seen that, in the <100> nanowire, a crystal plane of the end portion from which electrons are to be emitted includes at least {111} and {110}, and therefore can efficiently emit electrons.

Similarly, as shown in FIG. 12(B), a region corresponding to the {111} plane is the most brightly shown. Thus, it could be seen that field emission occurs from this plane. That is, it could be seen that, in the <110> nanowire, a crystal plane of the end portion from which electrons are to be emitted includes at least {111}, and therefore can efficiently emit electrons.

Although not shown, with regard to the emitter in Comparative Example 4, it was confirmed that a region corresponding to the {111} plane is the most brightly shown, and field emission occurs therefrom.

Figure 13:
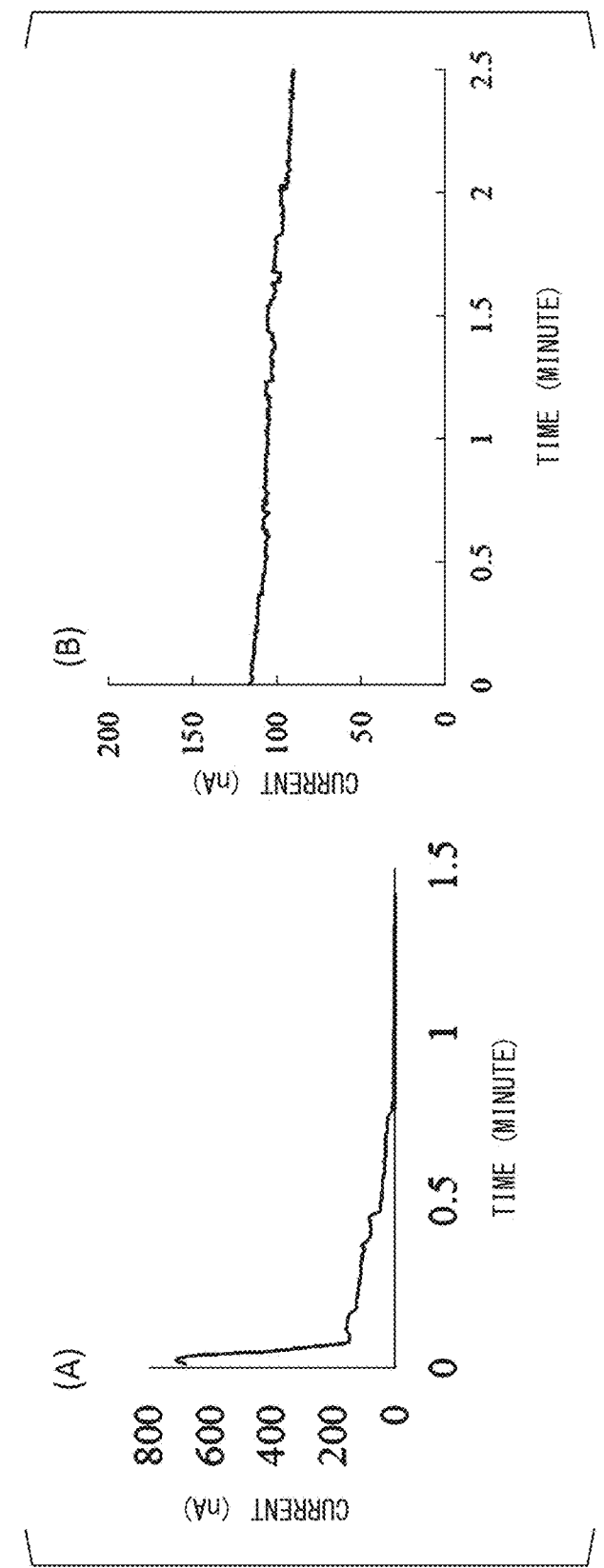
FIG. 13 is a view showing time dependency of a field emission current in emitters in Comparative Example 2 and Example 5.

FIG. 13 is a view showing time dependency of a field emission current in emitters in Comparative Example 2 and Example 5.

FIGS. 13(A) and 13(B) show the time dependency of the field emission current in the emitters in Comparative Example 2 and Example 5. As shown in FIG. 13(A), a field emission current of the emitter in Comparative Example 2 rapidly decreased after electric field application, and became approximately zero within time shorter than 1 minute. The reason for this is as follows. The tip end of the nanowire is terminated with Hf having a low work function by flushing. Accordingly, a lot of currents temporarily flow, but a lot of dangling bond exists on a surface that is terminated with Hf. As a result, stability is poor and the current flow is rapidly stopped. Although not shown, the time dependency of the field emission current of the emitters in Comparative Examples 3 and 4 exhibited the same tendency.

On the other hand, as shown in FIG. 13(B), the field emission current of the emitter in Example 5 was stabilized over a long period of time after electric field application. The current value thereof was as high as approximately 120 nA. Although not shown, the time dependency of the field emission current of the emitters in Examples 6 and 7 exhibited the same tendency.

The reason for the high current value of the emitter in Examples 5 to 7 is considered as follows. The end portion and surface from which electrons are to be emitted are covered with $HfO_2$. Accordingly, a work function of the end portion from which electrons are to be emitted decreases, and emission of electrons are promoted.

In addition, the reason for the stable field emission current characteristics of the emitters in Examples 5 to 7 over a long period of time is considered as follows. The end portion and surface from which electrons are to be emitted are covered with $HfO_2$. Accordingly, the dangling bond is lost.

From the above-described results, it could be seen that, in the emitters according to the present invention including the nanowire in which an end portion of the hafnium carbide single crystal, from which electrons are to be emitted, is covered with the hafnium oxide, the work function of the end portion from which electrons are to be emitted decreases due to the covering hafnium oxide, emission of electrons is promoted, and thus the emitter is excellent in electron emission characteristics. In addition, it could be shown that the dangling bond on the surface of the hafnium carbide single crystal, from which electrons are to be emitted, is lost due to the covering hafnium oxide, and thus electrons can be stably emitted over a long period of time.

INDUSTRIAL APPLICABILITY

When using the emitter of the present invention, electrons can be emitted in an efficient and stable manner. Accordingly, the emitter is employed in arbitrary apparatus having electron focusing capability such as a scanning electron microscope, a transmission electron microscope, a scanning transmission electron microscope, an auger electron spectrometer, an electron energy loss spectrometer, and an energy-dispersive electron spectrometer.

REFERENCE SIGNS LIST 100, 1020: Nanowire
110: Hafnium carbide (HfC) single crystal
120: Hafnium oxide ($HfO_2$)
210: Hemispherical surface
400: Electron gun
410, 1000: Emitter
420: Filament
430, 1010: Needle
440: Electrode
450: Lead-out power supply
460: Lead-out electrode
470: Acceleration power supply
480: Acceleration electrode
500: Producing apparatus
510: Gas raw material supply source
520: Line
530: Reaction chamber
540: Dryer
550: Pump
560: $HfCl_4$ powder
570: Graphite substrate
1030: Carbon pad

The invention claimed is:

1. An emitter, comprising:
a nanowire,
wherein the nanowire is formed from a hafnium carbide (HfC) single crystal,
at least an end portion of the hafnium carbide single crystal, from which electrons are to be emitted, is covered with hafnium oxide (HfO2) and
a shape of the end portion, from which electrons are to be emitted, is formed in a hemispherical shape through field evaporation processing.

2. The emitter according to claim 1, wherein the thickness of the hafnium oxide is 1 nm to 20 nm.

3. The emitter according to claim 2, wherein the thickness of the hafnium oxide is 1 nm to 10 nm.

4. The emitter according to claim 3, wherein the thickness of the hafnium oxide is 1 nm to 5 nm.

5. The emitter according to claim 1, wherein a longitudinal direction of the nanowire matches a <100> crystal direction, a <110> crystal direction, or a <111> crystal direction of the hafnium carbide single crystal.

6. The emitter according to claim 5,
wherein a longitudinal direction of the nanowire matches a <100> crystal direction of the hafnium carbide single crystal, and
the end portion includes at least a {111} plane and a {110} plane.

7. The emitter according to claim 1, wherein a length of the nanowire in a transverse direction is 1 nm to 100 nm, and a length of the nanowire in a longitudinal direction is 500 nm to 30 µm.

8. The emitter according to claim 7,
wherein the length of the nanowire in the transverse direction is 10 nm to 60 nm, and the length of the nanowire in the longitudinal direction is 5 µm to 30 µm.

9. An electron gun, comprising:
at least an emitter,
wherein the emitter is the emitter according to claim 1.

10. The electron gun according to claim 9,
wherein the emitter further comprises a needle and a filament, and
the nanowire is attached to the filament through the needle formed from an element selected from the group consisting of tungsten (W), tantalum (Ta), platinum (Pt), rhenium (Re), and carbon (C).

11. The electron gun according to claim 9, wherein the electron gun is a cold-cathode field emission electron gun or a Schottky electron gun.

12. An electronic apparatus, comprising:
an electron gun,
wherein the electron gun is the electron gun according to claim 9, and
the electronic apparatus is one selected from the group consisting of a scanning electron microscope, a transmission electron microscope, a scanning transmission electron microscope, an auger electron spectrometer, an electron energy loss spectrometer, and an energy-dispersive electron spectrometer.

13. A method of producing the emitter according to claim 1, the method comprising:
a step of heating a nanowire formed from a hafnium carbide single crystal in an oxygen-containing atmosphere.

14. The method according to claim 13, wherein in the step of heating, an oxygen partial pressure is in a range of $1\times10^{-9}$ Pa to $1\times10^{-7}$ Pa.

15. The method according to claim 13, wherein in the step of heating, a heating temperature is in a range of 400° C. to 800° C.

16. The method according to claim 13, wherein in the step of heating, heating time is in a range of 1 minute to 10 minutes.

17. The method according to claim 13, wherein in the step of heating, an oxygen partial pressure is in a range of $5\times10^{-9}$ Pa to $5\times10^{-8}$ Pa, a heating temperature is in a range of 500° C. to 700° C., and heating time is in a range of 3 minutes to 7 minutes.

18. The method according to claim 13, wherein the nanowire formed from the hafnium carbide single crystal is produced by a method selected from the group consisting of: a chemical vapor deposition (CVD) method; a physical vapor deposition method; and a templating method.

19. The method according to claim 13, further comprising:
a step of subjecting a surface of one end of the nanowire, which is formed from the hafnium carbide single crystal, to field evaporation previous to the step of heating.

20. The method according to claim 19, further comprising:
a step of flushing the surface subsequently to the step of subjecting the surface to field evaporation.

* * * * *